United States Patent
Chiang et al.

[11] Patent Number: 6,122,495
[45] Date of Patent: Sep. 19, 2000

[54] DEVICE AND METHOD FOR DIGITIZING A RECEIVER SIGNAL STRENGTH INDICATOR (RSSI) SIGNAL

[75] Inventors: Hsing-Ya Chiang, Hsinchu; Hsiang-Te Ho, Ping-Chen, both of Taiwan

[73] Assignee: Winbond Electronics Corp., Hsinchu, Taiwan

[21] Appl. No.: 09/191,802

[22] Filed: Nov. 13, 1998

[30] Foreign Application Priority Data

Aug. 19, 1998 [TW] Taiwan ................................. 87113634

[51] Int. Cl.$^7$ ................................................. H04B 17/00
[52] U.S. Cl. ................................ 455/226.2; 455/226.4; 455/67.3; 375/317; 375/318
[58] Field of Search ........................... 455/67.3, 226.2, 455/226.1, 226.4; 375/317, 318

[56] References Cited

U.S. PATENT DOCUMENTS

| | | | |
|---|---|---|---|
| 5,239,666 | 8/1993 | Truby | 455/9 |
| 5,390,365 | 2/1995 | Enoki et al. | 455/553 |
| 5,408,693 | 4/1995 | Alton et al. | 455/212 |
| 6,009,124 | 12/1999 | Smith et al. | 375/267 |
| 6,011,963 | 1/2000 | Ogoro | 455/226.2 |

*Primary Examiner*—Nay Maung
*Assistant Examiner*—Temica M. Davis
*Attorney, Agent, or Firm*—Jiawei Huang; J.C. Patents

[57] ABSTRACT

A device and method for digitizing a RSSI signal in a wireless transmission system is disclosed, which comprises a micro-controller having a ring counter and a controller, a low-pass filter, and a comparator. To start a digitization process, the controller gradually increases a numeric control signal to control a ring counter to generate a square wave with different duty cycle. Subsequently, the square wave is filtered by a low-pass filter to obtain a DC threshold voltage. If the threshold voltage is larger than the RSSI voltage, the digitization process is complete and the final numeric control signal represents the digitized RSSI signal.

10 Claims, 5 Drawing Sheets

DEVICE AND METHOD FOR DIGITIZING A RECEIVER SIGNAL STRENGTH INDICATOR (RSSI) SIGNAL

CROSS-REFERENCE TO RELATED APPLICATION

This application claims the priority benefit of Taiwan application Ser. No. 87113634, filed Aug. 19, 1998, the full disclosure of which is incorporated herein by reference.

BACKGROUND OF THE INVENTION

1. Field of Invention

The present invention generally relates to a device and method for digitizing an analog signal, and more particularly to a device and method for digitizing a receiver signal strength indicator (RSSI) signal in a wireless transmission system.

2. Description of Related Art

When a wireless transmission system, such as a mobile phone system, is in operation, transmission and receiving of signals are generally affected by the surrounding environment. To indicate the quality or strength of a received signal, a receiver signal strength indicator (RSSI) signal is typically generated from a transceiver of the wireless transmission system. Various operations or control modes are performed based on the RSSI signal indicated.

In another aspect, micro-controllers are becoming very popular nowadays, thanks to the advancements of semiconductor technologies. The functionality and speed of micro-controllers are significantly enhanced, while the size is significantly reduced. Furthermore, the power consumption of the micro-controllers are also reduced. It is no wonder that micro-controller are widely adopted as a controller in the wireless transmission system.

Basically, the RSSI signal from a transceiver is an analog signal. A digitization process needs to be performed for the RSSI signal before sending it to the micro-controller for processing. To digitize the RSSI signal into a digital one, a conventional analog to digital converter (ADC) can be used as shown in FIG. 1, where a wireless transmission system 100 includes a transceiver 110, a controller 120, and an ADC 130. The transceiver 110 is used to receive and transmit a radio frequency signal Srf, and output a RSSI signal Vsi as an indication of the signal strength. The controller 120, for example, a single chip micro-controller, is responsible for controlling operations of the wireless transmission system 100. The ADC 130 is used to digitize the analog RSSI signal Vsi into a digital signal Vsi', which is then used by the controller 220.

Although the above-mentioned method using an ADC to digitize the RSSI signal is convenient and straightforward, the cost, however, is higher. To reduce the cost, another conventional method as shown in FIG. 2 was proposed, in which a wireless transmission system 200 includes a transceiver 210, a controller 220, a comparator 231, and a digital to analog converter (DAC) 232. During the digitalization process, a numeric control signal SD from the controller 220 is sent to the DAC 232. A threshold voltage $V_{th}$, which is proportional to the numeric control signal SD is then generated from the DAC 232 as a comparison basis with the RSSI signal Vsi. When the RSSI signal Vsi is larger than the threshold voltage $V_{th}$, the numeric control signal SD is increased so that the threshold voltage $V_{th}$ is accordingly increased. The RSSI signal Vsi is then compared with the threshold voltage $V_{th}$ again. If the RSSi signal Vsi is still larger than the threshold voltage $V_{th}$, the above-mentioned process is repeated until the threshold voltage $V_{th}$ is larger than the RSSI signal Vsi, where the numeric control signal SD represents the digitized RSSI signal Vsi. As shown in FIG. 3, the threshold voltage $V_{th}$ with an increasing variation from a smallest value is depicted. The digitization process is not completed until the threshold voltage $V_{th}$ is larger than the RSSI signal Vsi at t1.

Although a DAC circuit using switches and resistors can be used instead of using the commercial DAC chip when accuracy and cost are not major concerns for digitizing the RSSI signal. However, the circuit complexities involved are significantly increased. The controller also needs extra output pins for sending the numeric control signal to the DAC. Furthermore, conventional digitization circuits constructed by using either ADC or DAC components have a fixed level (or step) for quantization, which is not flexible.

As a summary, the above-mentioned device for digitizing the RSSI signal has the following, disadvantages:

1. The costs are higher if the available commercial ADC or DAC components are used to construct the device.

2. The circuit complexities and quantities of components are increased if the self-designed DAC circuit using switches and resistors is used, which consequently increase the costs as well.

3. The conventional digitization methods have a fixed quantization level, which is not flexible.

SUMMARY OF THE INVENTION

It is therefore an objective of the present invention to provide a device and method for digitizing a RSSI signal in a wireless transmission system, so that the circuitry structure of the device can be simplified and costs can be reduced.

It is another objective of the present invention to provide a device and method for digitizing a RSSI signal in a wireless transmission system, so that the quantization level of the digitizing system can be flexibly changed to facilitate the detection and reading of the RSSI signal.

In accordance with the foregoing and other objectives of the present invention, a device and method for digitizing a RSSI signal in a wireless transmission system with a transceiver is provided, comprising a micro-controller, a low-pass filter, and a comparator. The transceiver of the wireless transmission system generates a RSSI signal when in operation. The micro-controller comprises a controller and a ring counter. The controller is responsible for controlling operations of the wireless transmission and the device. The ring counter receives a numeric control signal from the controller and generates a square wave having a duty cycle proportional to the numeric control signal. The square wave is then passed through a low-pass filter to obtain an approximate DC threshold voltage coupling to a comparator.

From the above-mentioned descriptions, it is understood that the device starts the digitization process for the RSSI signal by instructing the controller to generate a smallest numeric control signal, so that the ring counter generates a square wave having a smallest duty cycle. Subsequently, the controller examines if the RSSI signal is larger than the threshold voltage. When the RSSI signal is larger than the threshold voltage, the numeric control signal is gradually increased until the threshold voltage exceeds the RSSI signal, where the numeric control signal represents the digitized RSSI signal. That is, the device for digitizing the RSSI signal from the transceiver starts the digitization process by instructing the controller to send the numeric control signal in an increasing way so that the ring counter generates a square wave with different duty cycles. The square wave is then sent to the low-pass filter to obtain a DC threshold voltage. The output from the comparator, which compares the RSSI signal with the threshold voltage, is then sent to the controller to check if the threshold voltage is larger than the RSSI signal. If the threshold voltage is larger than the RSSI signal, the digitization process is complete and the final value of the numeric control signal represents the digitized RSSI signal.

According to a preferred embodiment of the present invention, the low-pass filter is a first-order low-pass filter comprising a capacitor and a resistor. The low-pass filter receives a discharging signal from the controller to discharge the capacitor before the digitization process begins.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
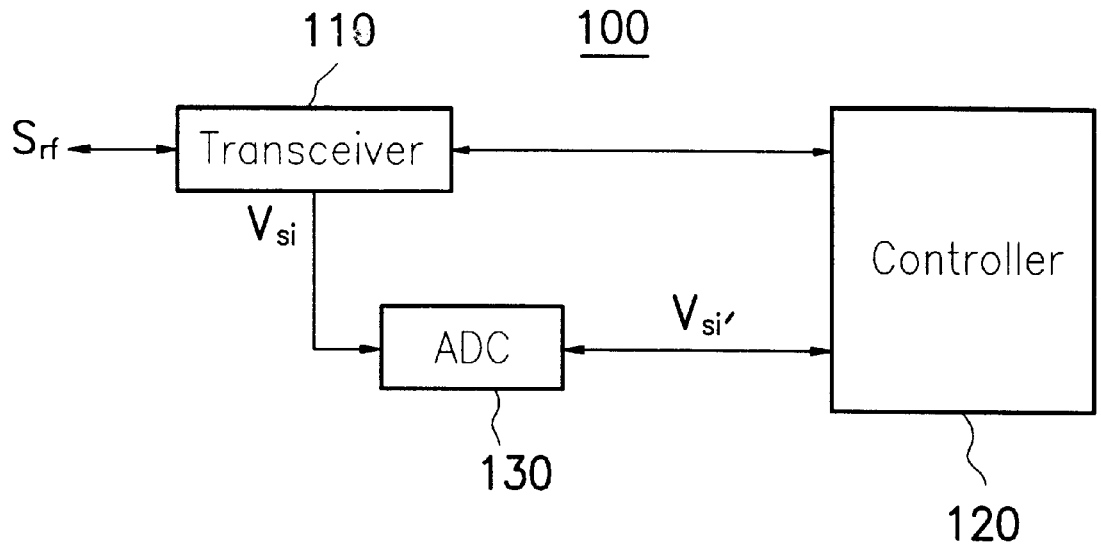
FIG. 1 is a block diagrammatic representation of a wireless transmission system including a digitization device using an ADC component.
Figure 2:
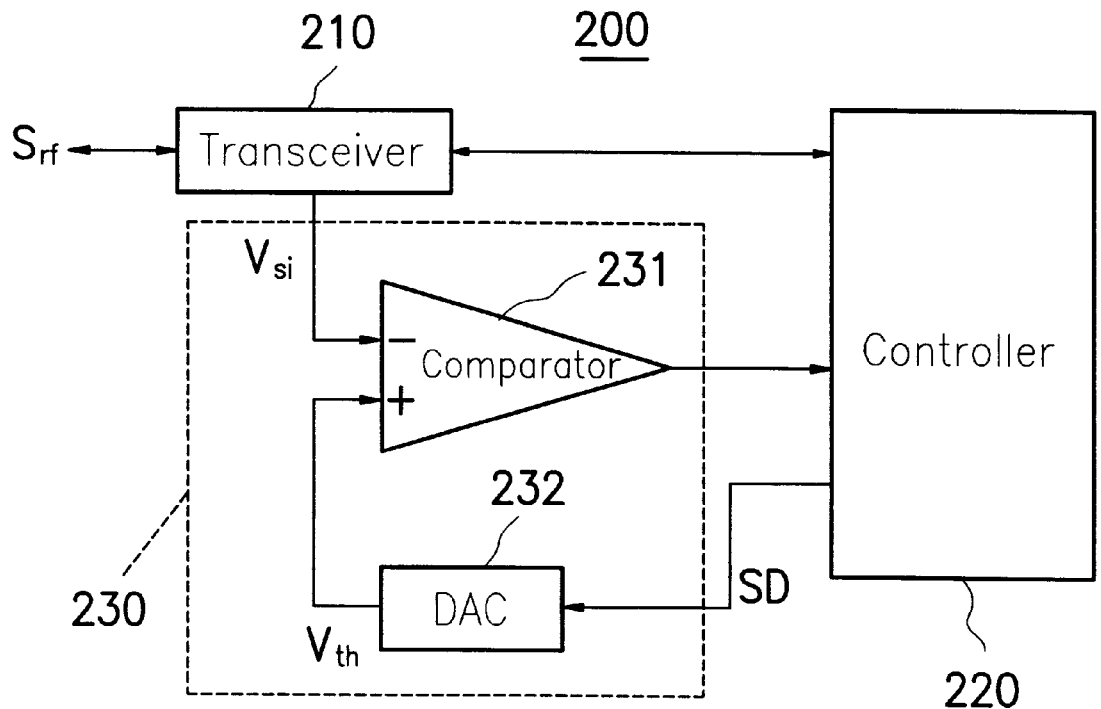
FIG. 2 is a block diagrammatic representation of a wireless transmission system including a digitization device using a DAC component.
Figure 3:
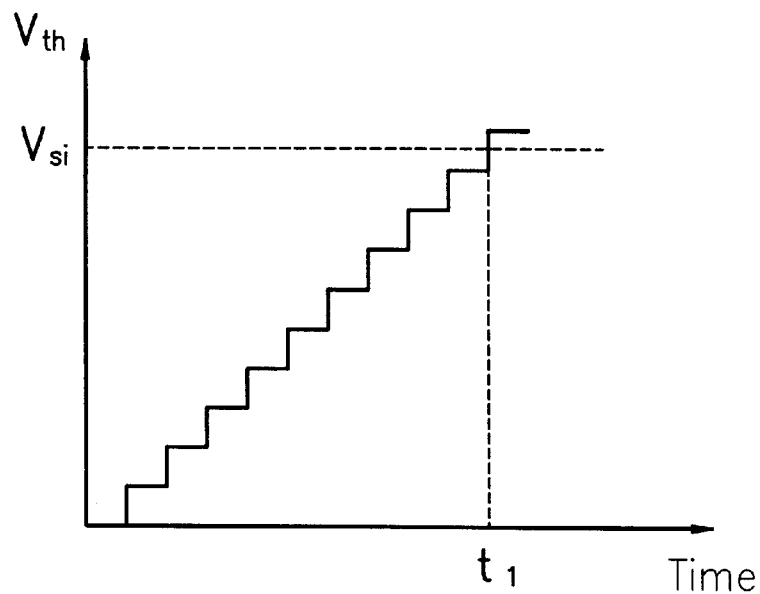
FIG. 3 is a diagram showing a gradual increase variation of the threshold voltage $V_{th}$.

Reference will now be made in detail to the present preferred embodiments of the invention, examples of which are illustrated in the accompanying drawings. Wherever possible, the same reference numbers are used in the drawings and the description to refer to the same or like parts.

Figure 4:
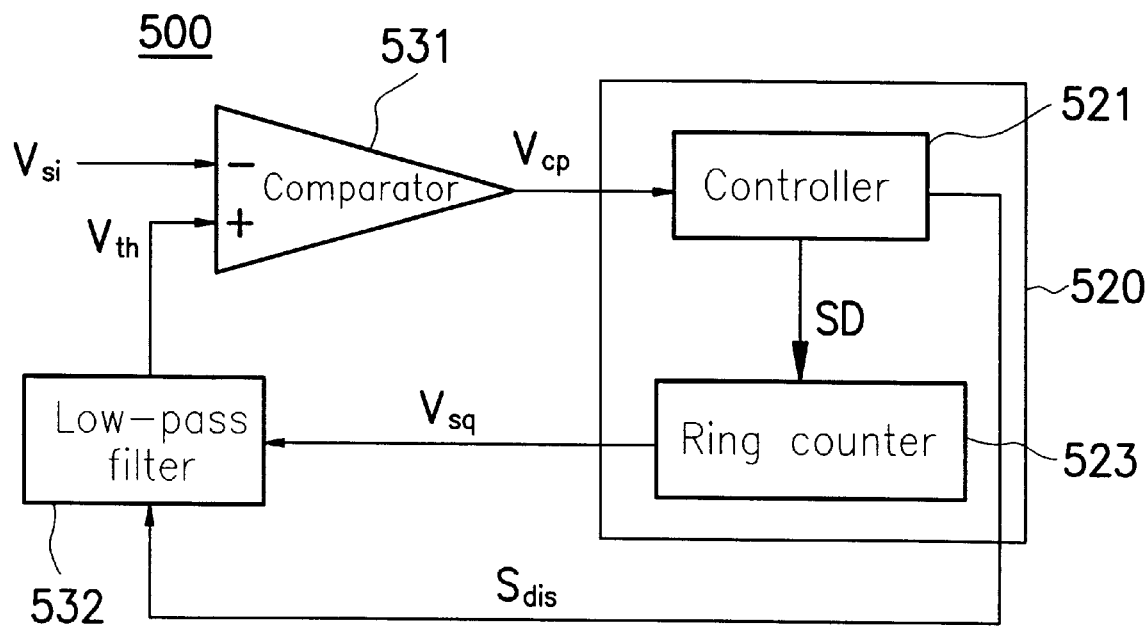
FIG. 4 is a block diagrammatic representation of a device for digitizing a RSSI signal according to a preferred embodiment of the present invention.
Figure 5:
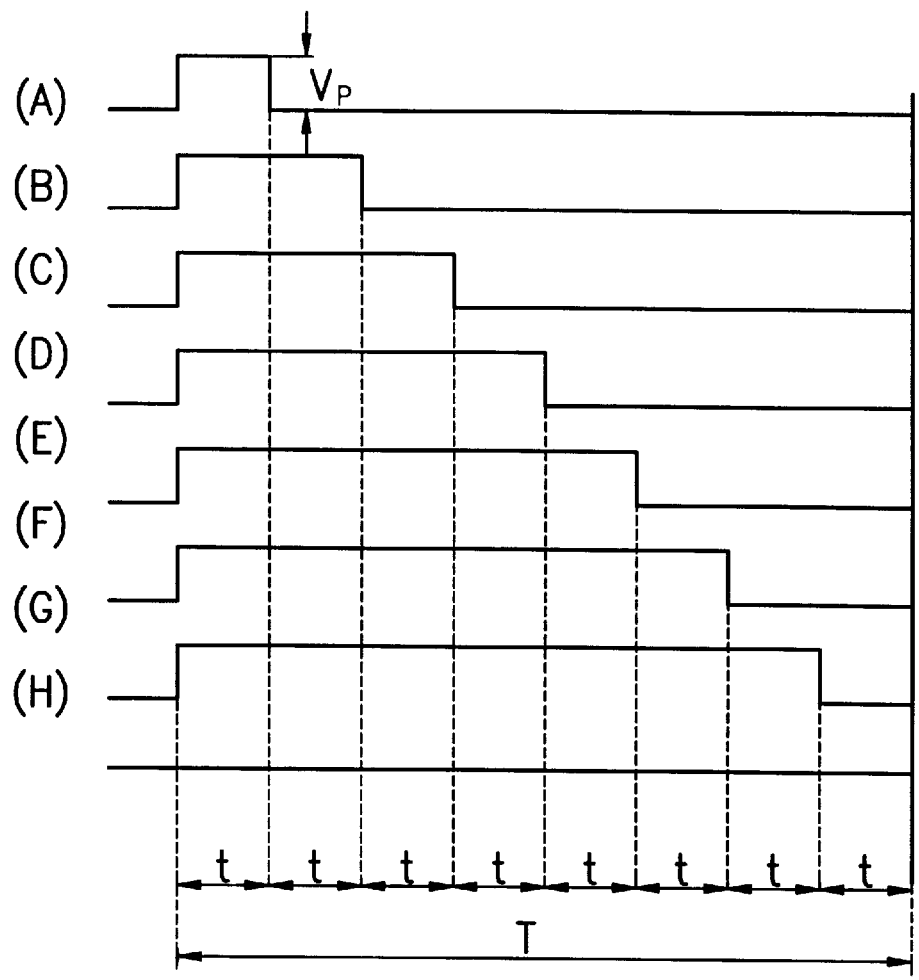
FIG. 5 is a diagram showing square waves having different duty cycles generated by a ring counter.

With reference to FIG. 4, a block diagrammatic representation of a device for digitizing a RSSI signal according to a preferred embodiment of the present invention is depicted, in which the device 500 is to digitize a RSSI signal Vsi from a transceiver in a wireless transmission. The device for digitizing a RSSI signal 500 includes a micro-controller 520, a comparator 531, and a low-pass filter 532, in which the micro-controller 520 comprises a controller 521 and a ring counter 523. The controller 521 is responsible for monitoring and controlling the operations of the device 500, as well as the whole wireless transmission system. The ring counter 523 is to generate a square wave of changeable duty cycle. The ring counter 523 receives a numeric control signal SD from the controller 521 to generate a square wave having a duty cycle proportional to the numeric control signal SD. As shown in FIG. 5, square waves $V_{sq}$ having different duty cycles are generated by the ring counter 523. In this preferred embodiment, there are eight quantization levels provided by the device 500. The eight waveforms in FIG. 5 represent eight square waves $V_{sq}$, each having a different duty cycle. Assume the period of the square wave $V_{sq}$ is T and the duty cycle can be changed by a unit of t, i.e., T=8*t. Waveforms (A), (B), (C), (D), (E), (F), and (G) are square waves having a duty cycle of ⅛, ⅖, ⅜, ⅘, ⅝, ⅚, ⅞, and 100%, respectively. The Vp in FIG. 5 stands for the peak voltage of the square wave. Therefore, the square wave having a duty cycle of ⅛ can be used to represent the numeric control signal of 0, the square wave having a duty cycle of ⅖ can be used to represent the numeric control signal of 1, and the square wave having a duty cycle of 100% can be used to represent the numeric control signal of 7, etc. Different quantization levels, for example, 4, 8, or 16 quantization levels, can be used based on practical requirements.

The square wave $V_{sq}$ from the ring counter 523 is sent to the low pass filter 532 to obtain an approximate DC threshold voltage $V_{th}$ whose amplitude depends on the duty cycle of the square wave $V_{sq}$. Various filters can be adopted as the low-pass filter 532, for example, a simple first-order low-pass filter or a second-order low-pass filter with a cut-off frequency somewhere between 1/10 to 1/20 of the frequency of the square wave $V_{sq}$, i.e., between 1/10T and 1/20T. Although the cut-off frequency should be as lower as possible, the timeframe allowed to digitize the RSSI signal, however, needs to be considered from the overall system point of view. The threshold voltage $V_{th}$ from the low-pass filter 532 can be represented as $V_{th}=t/T \times V_p$ Where $V_p$ is the peak voltage of the square wave $V_{sq}$.

Figure 6:
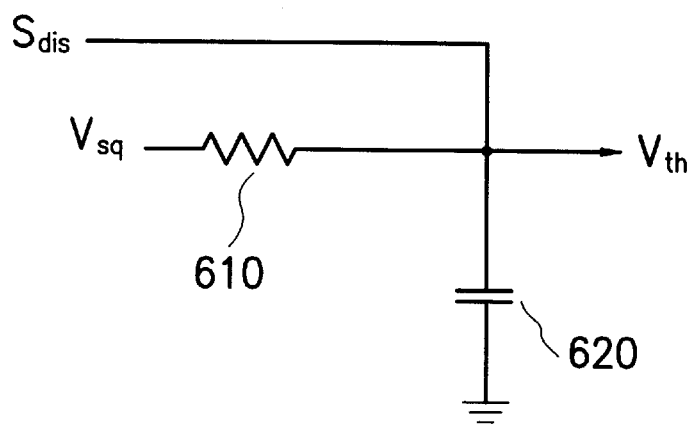
FIG. 6 is a circuit diagram of a first-order low-pass filter.

Reference is now made to FIG. 6, where a circuit diagram of a first-order low-pass filter, including a resistor 610 and a capacitor 620, is depicted. The capacitor 620 is connected to a discharging signal Sdis from the controller 521. Charges accumulated in the capacitor 620 are discharged before a digitization process begins.

The RSSI signal Vsi from the transceiver and the threshold voltage $V_{th}$ from the low-pass filter 532 are connected to inputs of the comparator 531 and a comparison signal Vcp generated from the comparator 531 is coupled to the controller 521 as shown in FIG. 4. When the RSSI signal Vsi is smaller than the threshold voltage $V_{th}$, the comparison signal Vcp is in the HIGH level; when the RSSI signal Vsi is higher than the threshold voltage $V_{th}$, the comparison signal Vcp becomes the LOW level. Therefore, the controller 521 detects whether the RSSI signal Vsi or the threshold voltage $V_{th}$ is larger from the comparison signal Vcp. If the RSSI signal Vsi and the threshold voltage $V_{th}$ to the comparator 531 are swapped, an opposite comparison result is obtained. However, the same objective can still be achieved by modifying programs in the controller 521.

During a digitization process, the controller 521 changes the numeric control signal SD to control the duty cycle of the square wave generated from the ring counter 523. By doing so, the duty cycle of the square wave from the ring counter 523 is gradually increased from ⅛, ⅖, etc, until 100%.

When the duty cycle of the square wave $V_{sq}$ changes, the threshold voltage $V_{th}$ also changes. When the threshold voltage $V_{th}$ is smaller than the RSSI voltage Vsi, the comparison signal from the comparator 531 is in the HIGH level. The numeric control signal SD is then gradually increased so that the duty cycle of the square wave $V_{sq}$ is increased and so is the threshold voltage $V_{th}$. When the threshold voltage $V_{th}$ exceeds the RSSI signal Vsi, the comparison signal from the comparator 531 becomes the LOW level. The controller 521 records the current numeric control signal SD, which represents the digitized RSSI signal.

Although the above-mentioned descriptions illustrate an approach where the duty cycle of the square wave starts from a smallest value, another approach where the duty cycle of the square wave starts from the 100% to ⅛ can also be adopted. In this case, when the threshold voltage $V_{th}$ is larger than the RSSI voltage Vsi, the duty cycle of the square wave $V_{sq}$ is reduced until the threshold voltage $V_{th}$ is lower than the RSSI signal Vsi, when the digitization process for the RSSI signal Vsi is completed. Of course, the duty cycle of the square wave $V_{sq}$ can be changed by some other ways. For example, the duty cycle of the square wave $V_{sq}$ might start from the middle, so that a decision to increase or decrease the duty cycle can be made, based on the comparison signal between the threshold voltage $V_{th}$ and the RSSI voltage Vsi, until a final result is obtained. Furthermore, the adjustment of duty cycle for each variation needs not be a fixed quantization level. Instead, a flexible changing level can be adopted so as to reduce the digitizing time required.

Figure 7:
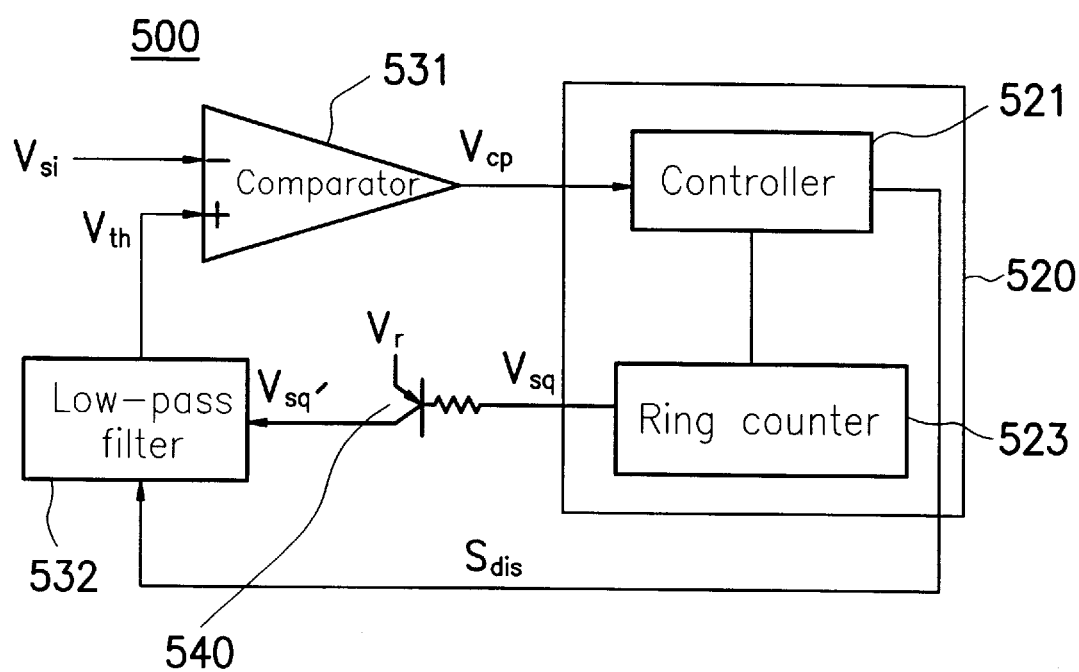
FIG. 7 is a block diagrammatic representation of a device for digitizing a RSSI signal according to another preferred embodiment of the present invention.

Note that the square wave $V_{sq}$ from the ring counter 523 is constrained by the working voltage used by the micro-controller 520. For example, if the working voltage used by the micro-controller 520 is +5V, the peak voltage of the square wave $V_{sq}$ is also limited within +5V. Therefore, the filtered DC voltage from the low-pass filter 532 is also within the +5V range. To overcome this problem of inflexibility of the threshold voltage in the device 500, a higher voltage level for the threshold voltage $V_{th}$ needs to be provided. With reference to FIG. 7, a block diagrammatic representation of a device for digitizing a RSSI signal is depicted according to another preferred embodiment of the present invention, in which the square wave $V_{sq}$ from the ring counter 523 is sent to a transistor 540 first and then to the low-pass filter 532. The transistor 540 serves as an electronic switch, which is controlled by the square wave $V_{sq}$ from the ring counter 523 to determine the ON/OFF status. When the transistor 540 is ON, the square wave $V_{sq}'$ is approximately equal to a reference voltage Vr. When the transistor 540 is OFF, the square wave $V_{sq}'$ is approximately equal to 0V. Therefore, the square wave $V_{sq}'$ is a square wave having an amplitude varying from 0V to Vr, which has the same frequency as the square wave $V_{sq}$. The duty cycle of the square wave $V_{sq}'$ is also proportional to the numeric control signal SD, while the amplitude of the square wave $V_{sq}'$ is determined by the reference voltage Vr. The square wave $V_{sq}'$ from the transistor 540 is filtered by the filter 532 to obtain an approximate DC threshold voltage $V_{sq}'$. When the reference voltage Vr is changed, the variation range of the threshold voltage $V_{th}$ changes accordingly. Therefore, the reference voltage Vr can be adjusted based on the dynamic range of the RSSI signal Vsi.

Figure 8:
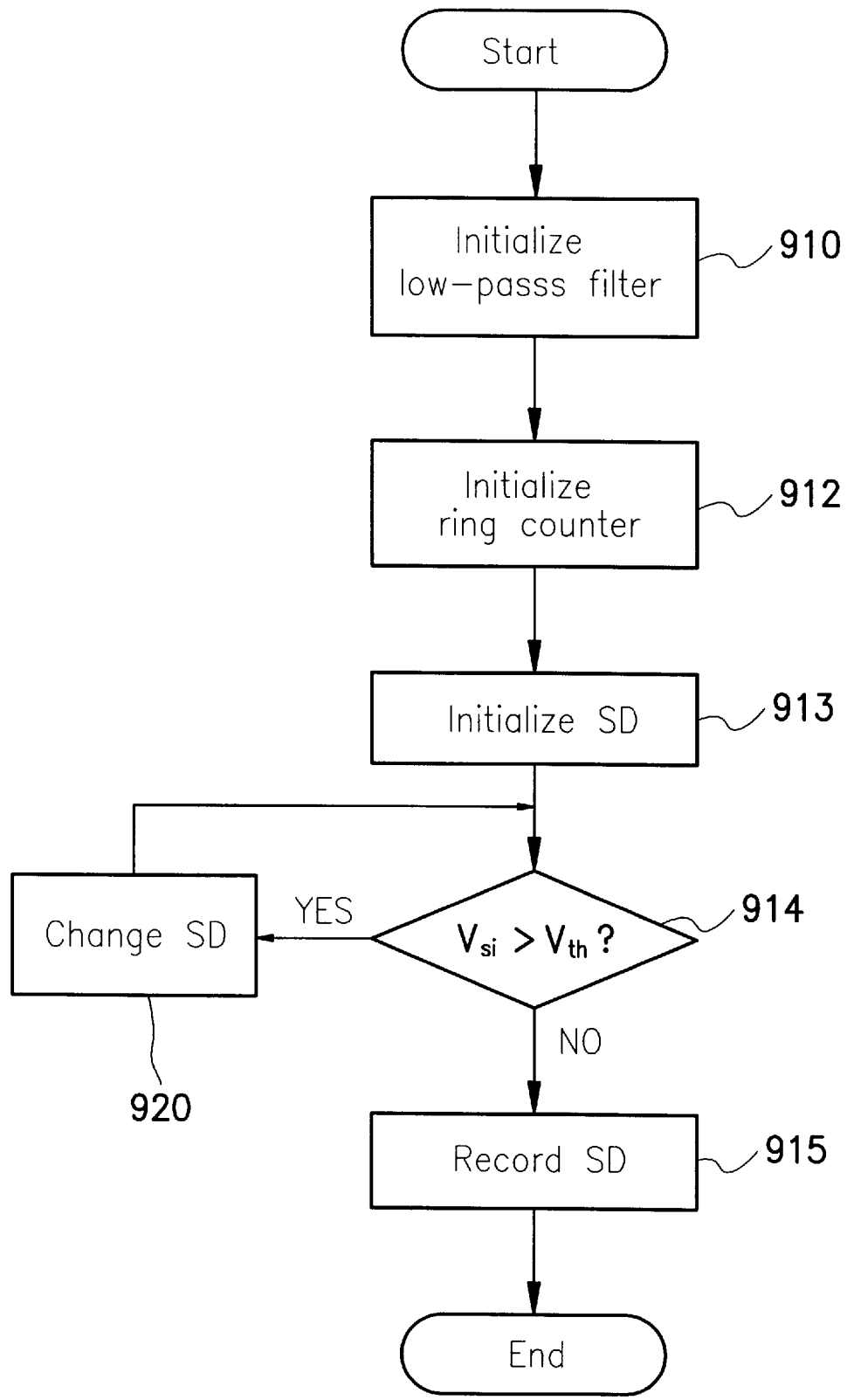
FIG. 8 is a flow chart showing a digitization process according to the preferred embodiments of the present invention.

The operation of the above-mentioned digitization device can be best illustrated by a flow chart as shown in FIG. 8, which will be described in detail hereonafter.

Before the digitization process begins, the low-pass filter 532 is initialized by discharging the capacitor (Block 910), so that the system is not affected by the previous digitization process. The ring counter 532 is then initialized (Block 912) to set a default value for the ring counter 523 and then cleared. Subsequently, an initial value is given to the numeric control signal SD (Block 913), for example, 0V, which is then sent to the ring counter 523 to generate a square wave $V_{sq}$ or $V_{sq}'$ having a smallest duty cycle. The square wave $V_{sq}$ or $V_{sq}'$ is used to generate a smallest threshold voltage $V_{th}$. The controller 521 examines if the RSSI signal Vsi is larger than the threshold voltage $V_{th}$ by checking the comparison signal Vcp from the comparator 531 (Block 914). If the RSSI signal Vsi is larger than the threshold voltage $V_{th}$, the numeric control signal SD is increased by one step (Block 920), for example, from 0 to 1, or from N to N+1. The numeric control signal SD then goes to the ring counter 523 to generate another threshold voltage $V_{th}$. If the threshold voltage $V_{th}$ exceeds the RSSI signal Vsi, the numeric control signal SD is recorded as the digitized RSSI signal Vsi (Block 930).

Based on the above-mentioned descriptions, it is understood that to digitize the RSSI signal into a digital one, the controller gradually increases the numeric control signal to control the ring counter to generate a square wave having different duty cycle. The square wave is then sent to a low-pass filter to obtain a DC threshold voltage to compare with the RSSI signal. When the threshold voltage exceeds the RSSI signal, the digitization process is complete and the final numeric control signal represents the digitized RSSI signal.

The objective for digitizing a RSSI signal according to the preferred embodiments of the present invention can be achieved by using a microprocessor or a microprocessor with simple firmware. The program in the firmware can also be modified to change the quantization level required so as to provide a simple and fast detection and reading for the RSSI signal. For example, in a wireless transmission system where two communicating destinations are in a well communicated environment, the resulting RSSI signal are generally larger. In this case, the quantization level can then be relaxed. Also, when the system is used in seeking unused channels for connections, the duty cycle of the square wave from the ring counter can be set at a particular default value. By examining the HIGH/LOW status from the output of the comparator, unused channels can be quickly identified.

From the above-mentioned descriptions, the device for digitizing a RSSI signal according to the preferred embodiments of the present invention has the following advantages:

1. The costs to construct the digitization device can be reduced without using the available commercial ADC or DAC components.

2. The circuit complexities and quantities of components for the digitization device are significantly reduced, and consequently the costs, with the use of a simple structure comprising a micro-controller having a ring counter, a low-pass filter, and a comparator to achieve the digitization functions.

3. The quantization level can be adjusted by changing the duty cycle of the square wave from the ring counter. Also, with a simple electronic switch and an adjustable reference voltage, the peak voltage of the square wave can be changed to match the dynamic range of the RSSI signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A device for digitizing a receiver signal strength indicator (RSSI) signal in a wireless transmission system having a transceiver which outputs a RSSI signal, the device for digitizing a RSSI signal comprising:

a micro-controller comprising a controller and a counter, responsible for monitoring and controlling operations of the wireless transmission system and the device for digitizing a RSSI signal, wherein the counter receives a numeric control signal from the controller and generates a square wave whose duty cycle is proportional to the numeric control signal;

a low-pass filter for filtering the square wave from the counter to obtain an approximate DC threshold voltage; and a comparator having two inputs connected to the RSSI signal and the threshold voltage, respectively, wherein the comparator generates a comparison signal coupled to the controller; wherein the controller changes the numeric control signal to control the duty cycle of the square wave from a smallest value, wherein the numeric control signal represents the digitized RSSI signal when the threshold voltage is larger than the RSSI signal during a digitization process.

2. The device for digitizing a RSSI signal of claim 1, wherein the low-pass filter comprises a resistor and a capacitor, wherein one terminal of the resistor receives the square wave and the other terminal of the resistor is coupled to a capacitor to generate the threshold voltage, wherein two terminals of the capacitor are connected to the resistor and a ground, respectively.

3. The device for digitizing a RSSI signal of claim 2, wherein the capacitor and the resistor are coupled to a discharging signal from the controller to discharge the capacitor before the digitization process begins.

4. A device for digitizing a receiver signal strength indicator (RSSI) signal in a wireless transmission system having a transceiver which outputs a RSSI signal, the device for digitizing a RSSI signal comprising:

a micro-controller comprising a controller and a counter, responsible for monitoring and controlling operations of the wireless transmission system and the device for digitizing a RSSI signal, wherein the counter receives a numeric control signal from the controller and generates a square wave whose duty cycle is proportional to the numeric control signal;

a low-pass filter for filtering the square wave from the counter to obtain an approximate DC threshold voltage; and a comparator having two inputs connected to the RSSI signal and the threshold voltage, respectively, wherein the comparator generates a comparison signal coupled to the controller; wherein the controller changes the numeric control signal to control the duty cycle of the square wave from a largest value, wherein the numeric control signal represents the digitized RSSI signal when the threshold voltage is smaller than the RSSI signal during a digitization process.

5. The device for digitizing a RSSI signal of claim 4, wherein the low-pass filter comprises a resistor and a capacitor, wherein one terminal of the resistor receives the square wave and the other terminal of the resistor is coupled to a capacitor to generate the threshold voltage, wherein two terminals of the capacitor are connected to the resistor and a ground, respectively.

6. The device for digitizing a RSSI signal of claim 5, wherein the capacitor and the resistor are coupled to a discharging signal from the controller to discharge the capacitor before the digitization process begins.

7. A device for digitizing a receiver signal strength indicator (RSSI) signal in a wireless transmission system having a transceiver which outputs a RSSI signal, the device for digitizing a RSSI signal comprising:

a micro-controller comprising a controller and a counter, responsible for monitoring and controlling operations of the wireless transmission system and the device for digitizing a RSSI signal, wherein the counter receives a numeric control signal from the controller and generates a control signal whose duty cycle is proportional to the numeric control signal;

a transistor having a base coupled to the control signal via a resistor, an emitter coupled to a reference voltage, and a collector, wherein the transistor is ON when the control signal is activated so that a square wave is generated from the collector;

a low-pass filter for filtering the square wave from the transistor to obtain an approximate DC threshold voltage; and a comparator having two inputs connected to the RSSI signal and the threshold voltage, respectively, wherein the comparator generates a comparison signal coupled to the controller; wherein the controller changes the numeric control signal to control the duty cycle of the square wave from a smallest value, wherein the numeric control signal represents the digitized RSSI signal when the threshold voltage is larger than the RSSI signal during a digitization process.

8. The device for digitizing a RSSI signal of claim 7, wherein the low-pass filter comprises a resistor and a capacitor, wherein one terminal of the resistor receives the square wave and the other terminal of the resistor is coupled to a capacitor to generate the threshold voltage, wherein two terminals of the capacitor are connected to the resistor and a ground, respectively.

9. The device for digitizing a RSSI signal of claim 8, wherein the capacitor and the resistor are coupled to a discharging signal from the controller to discharge the capacitor before the digitization process begins.

10. A method for digitizing a receiver signal strength indicator (RSSI) signal in a wireless transmission system having a transceiver which outputs a RSSI signal, the method for digitizing a RSSI signal comprising the steps of:

providing a numeric control signal;

generating a square wave according to the numeric control signal, wherein the duty cycle of the square wave is proportional to the numeric control signal;

filtering the square wave to obtain an approximate DC threshold voltage;

setting the numeric control signal with a smallest value;

gradually increasing the numeric control signal when the RSSI signal is larger than the threshold voltage until the threshold voltage exceeds the RSSI signal; and recording the value of the numeric control signal as the digitized RSSI signal.

* * * * *